United States Patent [19]

Takagi

[11] 4,082,636
[45] Apr. 4, 1978

[54] ION PLATING METHOD

[75] Inventor: Toshinori Takagi, Nagaokakyo, Japan

[73] Assignee: Sharp Kabushiki Kaisha, Osaka, Japan

[21] Appl. No.: 648,296

[22] Filed: Jan. 12, 1976

[30] Foreign Application Priority Data

Jan. 13, 1975 Japan .................................. 50-6666
Jan. 13, 1975 Japan ............................. 50-7304[U]

[51] Int. Cl.² .......................................... C23C 15/00
[52] U.S. Cl. ............................. 204/192 N; 118/49.1; 204/298
[58] Field of Search ............... 204/192, 298; 118/49.1, 118/49.5

[56] References Cited

U.S. PATENT DOCUMENTS 3,583,361  6/1971  Laudel, Jr. ......................... 118/49.5
3,732,158  5/1973  Przybyszewski et al. ........... 204/192

Primary Examiner—Aaron Weisstuch
Attorney, Agent, or Firm—Birch, Stewart, Kolasch & Birch

[57] ABSTRACT

In atomistic film deposition processes employing ion plating technology, an ion source is provided which includes a filament, an ionization electrode and an ion acceleration electrode. The voltage relationships between these electrodes are altered so as to form many kinds of fine-quality deposited films in a multi-layer fashion.

6 Claims, 5 Drawing Figures (A)

(B)

(C)

ION PLATING METHOD

BACKGROUND OF THE INVENTION

The present invention pertains to an ion plating or deposition method whereby deposited films are formed in a multi-layer fashion on a substrate under different operating conditions.

Generally, in ion plating such as ionized cluster deposition or other ion deposition, material is ionized and accelerated toward a substrate with kinetic energy imparted thereto to obtain deposited films which show good adhesion to the substrate.

It is an object of the present invention to provide an improved ion plating method which enables the formation of a multi-layer structure in which respective layers are deposited upon a substrate under conditions where a ratio of ionized particles to neutral particles is achieved. The present invention is dependent upon the novel fact that better results in film formation are achieved by depositing a mixture of ionized high speed particles and neutral particles on the substrate at the same time.

DETAILED DESCRIPTION OF THE INVENTION

Figure 1:
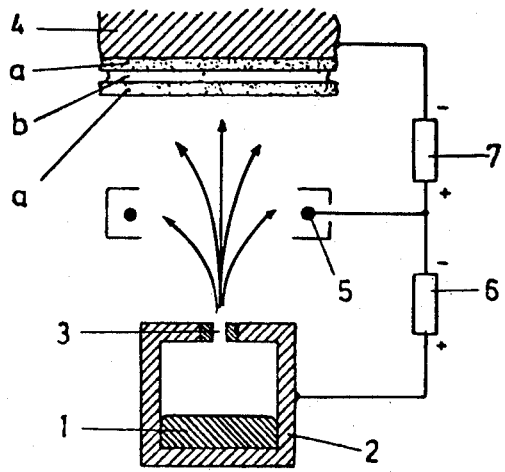
FIG. 1 is a schematic diagram of an ion beam deposition system embodying the present invention.

Referring now to FIG. 1, material 1 to be deposited is introduced into an ionization electrode assembly 2 wherein the material 1 is heated and held in molten and vaporized states. At the same time, vaporized material is partly ionized and ejected into a high vacuum or low gas pressure region through a nozzle 3 formed in the ionization electrode assembly 2.

Between the nozzle 3 and a substrate 4 spaced from the nozzle 3 there is provided an accelerator electrode assembly 5 for acceleration of ionized particles. Variable voltage d.c. power sources 6 and 7 are connected between the ionization electrode assembly 2 and the accelerator electrode assembly 5 and between the accelerator electrode assembly 5 and the substrate 4, respectively.

When the power sources 6 and 7 are connected to the ionization electrode assembly, the accelerator assembly and the substrate with the polarity as viewed in FIG. 1, the ionized particles emerging from the nozzle 3 are accelerated toward the substrate 4 with accompanying high energy so that the ionized particles strike on the substrate 4 to thereby form a deposited film (a). The film (a) obtained in this manner includes the ionized particles and neutral particles. The ratio of the ionized particles is controllable within a range of several % through several tens % by altering the applied voltages of the power sources 6 and 7.

When the power sources 6 and 7 are not operative or when the power sources 6 and 7 are connected with a reversal in polarity, a different film (b) is deposited on the substrate 4. That is, the film (b) consists essentially includes only the of neutral particles in the same way as in conventional vacuum evaporation.

Figure 2:
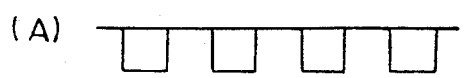
FIGS. 2 A, B and C are waveform diagrams of voltages applied to electrodes within the system of FIG. 1.
Figure 2:
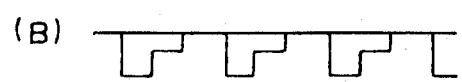
Figure 2:
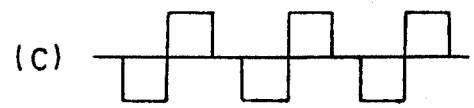

Pursuant to the principle of the present invention, pulse controlled voltage as shown in FIG. 2 (A), (B) or (C) is derived from the variable voltage power sources 6 or 7 such that the operating circumstances when the ionized particles strike the substrate 4 together with the neutral or non-ionized particles, are altered in a manner to form a multi-layer structure made up of the deposited films.

In the case where the pulse shown by FIG. 2 (C) is impressed on the substrate 4, the ionized particles are repelled and therefore deposition of the ionized particles on the substrate 4 does not occur during the positive portion of the applied pulse.

The concept of the present invention is applicable to the new deposition technique called "ionized-cluster-beam deposition". A detailed description of the new deposition technique is fully illustrated and described in copending U.S. Pat. application Ser. No. 625,041 entitled VAPOURIZED-METAL CLUSTER ION SOURCE AND IONIZED-CLUSTER BEAM DEPOSITION, filed on Oct. 23, 1975, by the inventor, which is incorporated hereto.

Figure 3:
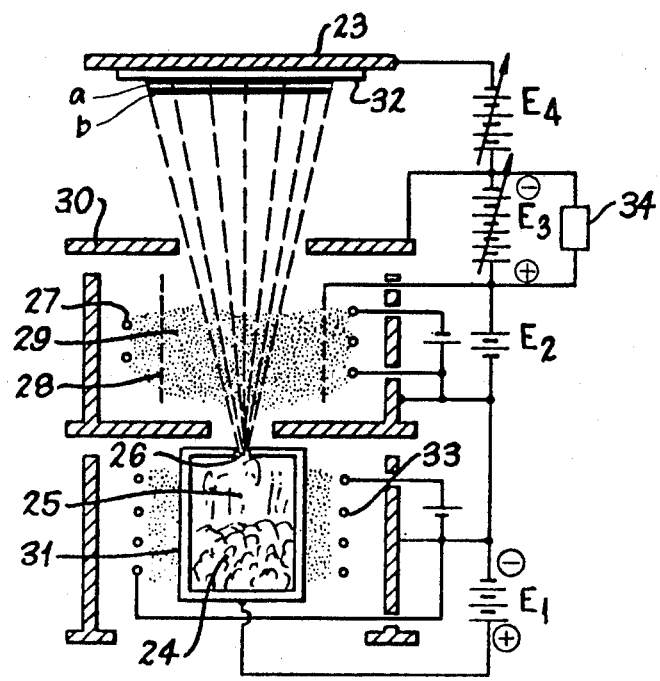
FIG. 3 is a brief illustration of an ionized cluster beam deposition system embodying the present invention.

FIG. 3 shows a brief illustration of the ionized cluster beam deposition system which includes crucible 31, substrate 32, substrate support 23, electron issuing filament 33 for heating the crucible 31, material 24 to be vapourized, vapourized material 25, ejection nozzle 26, electron issuing filament 27, electron accelerator electrode 28, electron cloud 29 established for the purpose of ionizing the cluster and cluster ion accelerator electrode 30. The substrate 32 is housed in a sealed chamber which is held at a high vacuum in the range of region ($10^{-4} - 10^{-6}$ Torr.). Electrons from the filament 33 are accelerated toward the crucible 31 by electron accelerator voltage source $E_1$, thereby heating the crucible 31 due to electron bombardment. The result is that the material 24 is vapourized with a vapour pressure of $10^{-2} - 10$ Torr. Therefore, the material is ejected out through the nozzle 26 to form atom aggregates or clusters about the nozzle due to the adiabatic expansion. The atom aggregates or clusters are ionized as they pass through electron cloud 29 established by means of electron accelerator electrode 28 and filament 27. Then, they are accelerated toward substrate 32 together with non-ionized neutral clusters by means of cluster ion accelerator electrode 30 and substrate support electrode 23.

In accordance with the concept of the present invention, ion accelerator voltage source $E_3$ operatively associated with cluster ion accelerator electrode 30 contains voltage supply controlling means 34, which can be implemented with a conventional switching circuit when it is desired to employ the voltage waveform of FIG. 2 (A).

The inventor's experiments show that the ratio of the ionized to neutral particles within the deposited film has remarkable effects on the morphology and the adhesion of the deposited films to the substrate. As noted earlier, the ratio of the ionized particles to neutral particles is, for example, from 15 to 60 percent in the system of FIG. 3.

In the deposition of Cu on glass, adhesion strengths as follows are obtained when the ionization voltage is 600V and the ionization current is 300mA.

9 KV acceleration: 200 Kg/cm$^2$
3 KV acceleration: 20-30 Kg/cm$^2$
0 KV acceleration: 6 Kg/cm$^2$
vacuum evaporation: 0.5 Kg/cm$^2$ The deposition rates obtained in this example are:

9 KV acceleration: 6000 A/min.
6 KV acceleration: 8000 A/min.

0 KV acceleration: 12,000 A/min.

It will be noted that reduction of the deposition rate in the case of 9 KV acceleration is due to sputtering effects.

In addition, the interfacial state or the deposit morphology is enhanced with increase in the incident energy of cluster ions or the ion accelerator voltage. Enchanced morphology (i.e., the columnar morphology but not the domed structure) is expected when the accelerator voltage is 4 KV – 6 KV.

Accordingly, as illustrated in FIG. 2B one way to form deposited films showing good adhesion and enhanced growth morphology consists of application of a high acceleration voltage of about 9 KV to form a deposited film showing good adhesion and subsequent application of low acceleration voltage of about 6 KV to form a deposited film having enhanced growth morpholgy. Repeated application of high and low acceleration voltages is possible.

In order to form a deposited film in a desired pattern, it is preferable that a material which is soluble in water, alcohol or acetone, for example, gelatine, is provided at undesired areas before ion plating or ionized-cluster beam deposition is performed.

While only certain embodiments of the present invention have been described, it will be apparent to those skilled in the art that various changes and modifications may be made therein without departing from the spirit and scope of the invention as claimed.

What is claimed is:

1. An ion plating method comprising the steps of:
    preparing an ion plating device which comprises an ionization electrode assembly for ionizing material to be deposited, an ion accelerator electrode assembly for accelerating the ionized particles of the material and a substrate on which the ionized particles together with neutral particles are deposited;
    applying a first variable-voltage power source between the ionization electrode assembly and the ion accelerator electrode assembly;
    applying a second variable-voltage power source between the ion accelerator electrode assembly and the substrate;
    varying the output of the first and second variable-voltage power sources to regulate the ratio of ionized particles to neutral particles, which are incident on the substrate, thereby forming a multi-layer structure of deposited films.

2. An ion plating method as defined in claim 1, wherein the steps of applying the first and second voltages includes the application of a relatively high voltage to the accelerator electrode assembly for increasing the adhesion strength of the deposited film and subsequent application of a relatively low voltage to the acceleration electrode assembly for enhancing the growth morphology of the deposited film.

3. An ion plating method as defined in claim 1 wherein the ion plating device includes a cluster ion generating means.

4. An ion plating method as defined in claim 1, wherein said first and second variable-voltage sources are varied from a first voltage which accelerates a predetermined quantity of ions toward said substrate to a second voltage which precludes the acceleration of any ions toward said substrate, whereby a first layer is deposited on said substrate during the application of said first voltage, said layer being formed from both ions and neutral particles and a second layer is deposited on said substrate during the application of said second voltage, said second layer being formed from essentially neutral particles.

5. An ion plating method as defined in claim 4, wherein the second voltage is equal to 0.

6. An ion plating method as defined in claim 4, wherein the second voltage is of an opposite polarity to said first voltage.

* * * * *